United States Patent [19]
Planey

[11] 3,772,577
[45] Nov. 13, 1973

[54] GUARD RING MESA CONSTRUCTION FOR LOW AND HIGH VOLTAGE NPN AND PNP TRANSISTORS AND DIODES AND METHOD OF MAKING SAME

[75] Inventor: William B. Planey, Dallas, Tex.

[73] Assignee: Texas Instruments Incorporated, Dallas, Tex.

[22] Filed: Feb. 10, 1972

[21] Appl. No.: 225,202

[52] U.S. Cl. ...... 317/235 R, 317/235 F, 317/235 AJ
[51] Int. Cl. .............................................. H01l 9/00
[58] Field of Search .......................... 317/235, 22.11

[56] References Cited

UNITED STATES PATENTS 3,500,139 3/1970 Frouin et al. ...................... 317/235
3,492,174 1/1970 Nakamura et al. ................ 148/175

*Primary Examiner*—John W. Huckert
*Assistant Examiner*—E. Wojciechowicz
*Attorney*—Harold Levine et al.

[57] ABSTRACT

Disclosed is a high voltage semiconductor PN junction device of mesa construction which features a highly doped collector guard ring circumscribing the mesa. By terminating any induced collector-base inversion layers in the guard ring, increased temperature stability and decreased reverse current leakage characteristics are achieved.

17 Claims, 4 Drawing Figures

Figure 1:
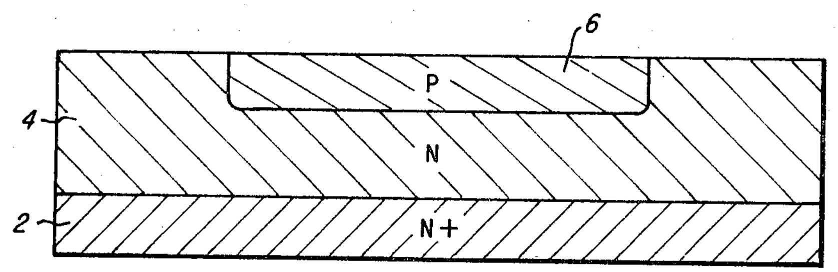

GUARD RING MESA CONSTRUCTION FOR LOW AND HIGH VOLTAGE NPN AND PNP TRANSISTORS AND DIODES AND METHOD OF MAKING SAME

This invention relates to high voltage semiconductor devices having PN junctions, and more specifically to high voltage semiconductor devices of the mesa type which employ a collector guard ring to decrease base-collector inversion layers at high temperature and high voltage to thereby increase reliability.

Early problems encountered in the successful manufacturing of diodes and transistors of the mesa type included the control and elimination of base-collector leakage and inversion paths. After etching the device to form the moat to thereby define the mesa, the exposed base-collector surface was typically susceptible to contamination problems which led to inversion, leakage, and low voltage breakdown characteristics. To alleviate this contamination problem, the moat was subsequently filled with an insulating material to protect the PN interface exposed during the moat-etching step. This movement, however, did not eliminate inversion regions or channels from forming between the base-collector interface. During high voltage operation, a channel may extend from the base region along the moat isolation interface into the collector region to degrade device performance substantially. If this channel extends completely across the surface of the collector to reach the edge of the collector region, a relatively large current flows when the collector is reverse biased. A large leakage current thus results, especially under high voltage and high temperature operating conditions.

Semiconductor devices of the mesa type are particularly advantageous for applications requiring high voltage operation. As opposed to devices of the planar type (i.e., devices having all electrical contacts on the same planar surface) mesa devices feature PN junctions which are deeper junctions and thereby provide higher voltage breakdown characteristics. Furthermore, planar diffused junctions have typically limited voltage breakdown characteristics due in part to contamination of the oxide layer formed overlying the collector region during processing. High collector voltage application to the contaminated collector oxide-collector surface causes surface break down, resulting in a device having a degraded breakdown characteristic.

Accordingly, it is an object of the present invention to produce a semiconductor PN junction device of mesa construction which lowers collector-base junction leakage by terminating any inversion channel which forms between the semiconductor conductivity types. It is a further object of the present invention to produce a method for constructing a PN junction semiconductor device of the mesa type which eliminates surface-induced channel inversion regions between regions of opposite conductivity type.

One feature of the invention is that the device is capable of functioning at high operating voltages with low leakage current characteristics. Another feature of the invention is that the device is able to function reliably at high operating temperatures for a sustained period of time.

These and other objects and features are provided in accordance with the present invention by forming on a semi-conductor PN junction device of the mesa type of a highly doped guard ring circumscribing the moat. As used in this application, "a semiconductor device of the mesa type" will refer to a semiconductor PN junction device having electrical contacts on non-planar surfaces. For illustrative purposes only, the semiconductor layer of one conductivity type having the region of opposite conductivity therein to form the PN junction will be called the collector and the region of opposite conductivity thereon will be called the base. The highly doped collector guard ring is of the same conductivity type as the collector. layer and is contiguous with the moat, or isolation void which is etched around the base and into the collector for electrical isolation and passivation purposes. The moat is contiguous with the base, and accordingly the sides of the moat form a continuous path between the base region and the collector guard ring through the collector region. Therefore, during high voltage and high temperature operation, any inversion paths, which tend to form from the base along the sides of the moat and into the collector, will terminate in the highly doped collector guard ring, thereby precluding any junction leakage and any adverse effect resulting therefrom.

Figure 2:
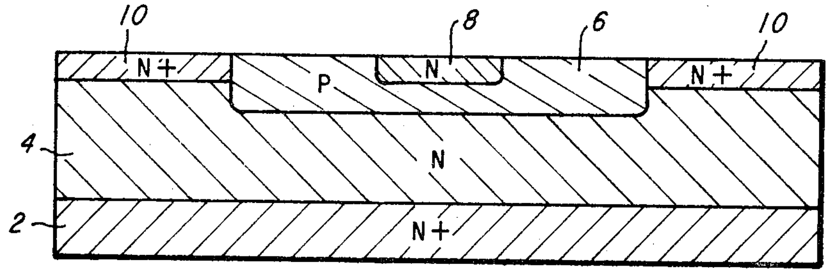
Figure 3:
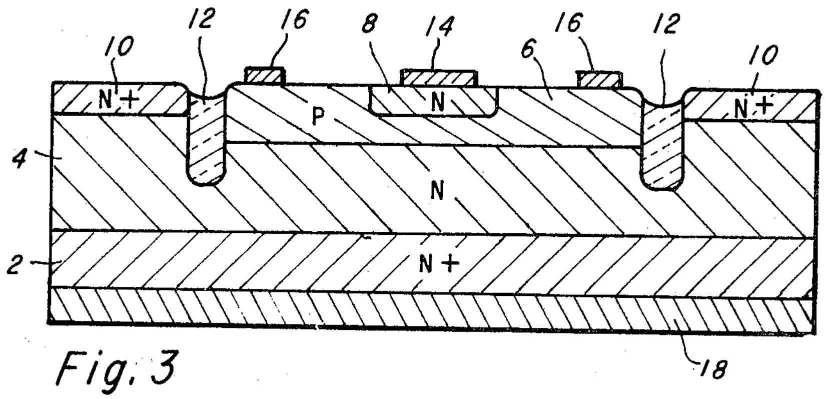
Figure 4:
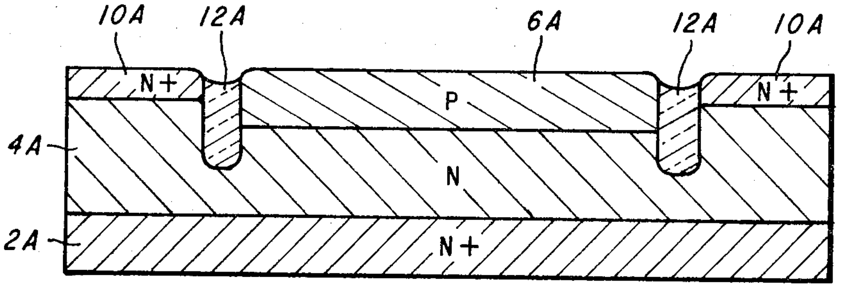

FIGS. 1–3 are enlarged cross-sectional views depicting steps in the method of constructing a transistor according to one embodiment of the invention; and FIG. 4 is an enlarged cross-sectional view depicting a semiconductor diode in accordance with another embodiment of the invention.

With reference now to FIGS. 1–3 and in particular to FIG. 3, there is shown an NPN mesa transistor constructed in accordance with one embodiment of the present invention. The transistor is comprised of a heavily doped N-type (N+) region 2, having thereon a second layer 4 of N-type semiconductor material; also connected to layer 2 is electrical contact 18. Layer 2 is typically 15 mils in thickness and layer 4 is typically 0.4 to 3 mils in thickness. Within layer 4 is a first region of P-type material having an exposed surface to which electrical contacts 16 are connected. Circumscribing region 6 is a moat 12 which may contain an insulating material such as a passivating varnish, silicon dioxide or insulating glass. A suitable glass comprises a combination of 50 percent lead oxide, 40 percent silicon dioxide, 10 percent aluminum oxide or equivalent. Within region 6 is heavily doped N-type region 8 also having an exposed surface to which electrical contact 14 is attached. Circumscribing the moat 12, and selectively overlying layer 4, is a third region 10 of heavily doped N-type material. Region 10 is contiguous with the moat 12, and moat 12 is contiguous with the P-region 6.

Referring now to FIG. 1, the method of the present invention for fabricating the device as illustrated in FIG. 3 comprises forming a first heavily doped N-type (N+) substrate layer 2 which has a (111) or (100) crystallographic orientation. Substrate layer 2 is heavily doped with phosphorous and has a resistivity of about 0.007 to 0.020 ohm-centimeters and is about 15 milli-inches thick. After proper surface preparation, a second N-type layer 4 is grown on the surface of the substrate 2 using conventional epitaxial vapor deposition techniques. For example, layer 4 is typically doped with phosphorous while being epitaxially grown at approximately 1180° C. until a thickness is achieved of between 0.4 mils and 3 mils. The resistivity of layer 4 is between 2 and 50 ohm-centimeters, as determined according to the desired collector characteristics of that particular transistor type. Using standard photolithographic and diffusion techniques, P-type region 6 is diffused into the collector layer 4 to a depth of between 12 to 30 microns, depending upon the desired base characteristics. The region 6 typically is doped with boron until a resistance of between 70 to 100 ohms per square is achieved.

Referring now to FIG. 2, heavily doped N-type regions 8 and 10 are selectively diffused into the base region 6 and into the collector region 4 respectively, using standard photolithographic and diffusion techniques. The guard ring 10 must be placed in layer 4 within sufficient proximity to the base region 6 so as to insure that the subsequent moat-etched step will etch both region 6 and region 10. Utilizing a deposition and drive in sequence, an emitter region is formed 6 to 10 microns in depth by driving in phosphorous dopants at a temperature of 1200° C. A resistance of about 1 to 2 ohms per square is typically desirable.

Referring once again to FIG. 3, after the heavily doped regions 8 and 10 are formed, the moat 12 is formed. A void thus is etched typically 3 mils wide or sufficiently wide so as to intimately separate region 8 and region 10. That is, sufficient semiconductor material must be etched away so that the resulting void exposes region 8 as one side wall and region 10 as the other side wall. It is etched sufficiently deep to extend beyond the drive in depth of the base region 6. The etchant typically comprises 1 part hydrofluoric acid, 2 parts nitric acid and 1 part acetic acid. The depth of the void achieved during this mesa-etch step may reach typically between 20 to 40 microns, which, noting a collector depth of possibly 0.4 mil. inches and base depth of 12 micro inches, extends deeper than the depth of the base and possibly through the N layer 4 into the N+ layer 2. The moat 12 need not necessarily extend into N+ layer 2, but it may be desirable.

After the moat void has been etched, a quantity of insulating material is deposited in the void. Oxides may be grown, such as silicon dioxide, or a passivating varnish or insulating glass may be deposited therein. A produce marketed by Dow-Corning, entitled JUNCTION COATING 646 is a suitable varnish, and as earlier noted a $PbO-SiO_2-Al_2O_3$ composition is a suitable insulating glass. As is well-known in the art, if silicon dioxide is desired to be grown in the void, a 1 hour 1200° C. steam cycle may be utilized.

Using metal deposition techniques, which are well-known in the art, an emitter contact 14 and base contacts 16 are formed on N-type emitter region 8 and P-type base region 6, respectively. Collector contact 18 is likewise formed on the surface of N+ substrate layer 2.

The embodiment of FIG. 3 results in superior device performance and increased temperature stability characteristics. The collector guard ring 10 functions to terminate inversion paths between the base region 6 and collector layer 4, which paths are inherent to such transistor types. That is, under high voltage and high temperature operating conditions, inversion channels are induced from the P-type base region 6 along the inner wall of the isolation moat 12. As operating voltage and temperature increases, the inversion channel may increase along the inner wall and extend along the outer wall of the moat 12 and reach the surface of the collector 4. Upon further increased temperature and operating voltage conditions, the inversion channel could conventionally reach the edge of the die. However, utilizing the collector guard ring 10 of highly doped N-type material, as shown, the P-type inversion channel will terminate in the guard ring 10, as there is too high a concentration of N-type particles to induce a P-channel in the N+ region 10. Therefore, the inversion channel does not extend sufficiently to complete a path through the collector layer 4 to allow a significant amount of reverse current to flow through the collector-base junction under reverse biased conditions. Obviously, this inversion channel termination results in decreased junction leakage characteristics and/or higher operating voltage and temperature characteristics for the device.

The device as depicted in FIG. 3 utilizing the collector guard ring 10 achieves such increased performance parameters as a decrease of junction leakage current from 2.0 milliamps to 0.1 milliamps at 700 applied operating volts. Furthermore, the device is able to operable efficiently and reliably at an increased high voltage level of 300 volts instead of a conventional 150 volts, at an operating temperature of 150° C.

Another embodiment in accordance with the present invention is shown in FIG. 4 wherein a diode is depicted of the mesa type utilizing a collector guard ring. The elements of the diode of FIG. 4 may be formed as described according to the corresponding elements of the transistor in FIG. 3. However, it is noted in FIG. 4 that prior to the diffusion of the collector guard ring 10a (numeral 10 in FIG. 3), the emitter oxide aperture is not opened to allow diffusion into the base region *6a* during the deposition-drive in sequence. Accordingly, only a single PN junction device is formed. It is noted that, although not shown in FIG. 4, base electrical contacts and collector electrical contacts are formed on region *6a* and layer *2a*, respectively.

Operation of the diode as depicted in FIG. 4 is similar to the operation of the base-collector regions of the transistor in FIG. 3. Guard ring *10a* terminates any base-collector inversion regions which may form along the collector surface so as to reduce leakage and thereby improve operating characteristics of the diode.

Although the invention has been described with respect to two specific embodiments of a mesa-type, PN junction semi-conductor device, it is to be understood that both PNP and NPN mesa-types may be formed. Furthermore, other types of semi-conductor materials beside silicon may be equally advantageously utilized, such as germanium.

Although specific embodiments of this invention have been described herein in conjunction with mesa devices, various modifications to the details of structure and to the steps disclosed in constructing the device will be apparent to those skilled in the art without departing from the scope of the invention.

What is claimed is:

1. A high voltage passivated semiconductor device of mesa construction and having a guard ring, said device comprising:

a. a first layer having upper and lower surfaces of highly doped semiconductor material of one conductivity type adapted to receive an electrical contact on said lower surface;

b. a moderately doped second layer of semiconductor material of said one conductivity type overlying said upper surface of said first layer;

c. a first region of semiconductor material of opposite conductivity type within said second layer having an exposed surface;
d. isolation means circumscribing said first region and extending into said second layer for isolating selective areas of said first region; and
e. a highly doped second region of said one conductivity type overlying said second layer and circumscribing said isolation means.

2. The semiconductor device of claim 1 further comprising:
a. first electrical contacts to the exposed surface of said first layer; and
b. second electrical contacts to said exposed surface of said first region.

3. The semiconductor device of claim 1 wherein said one conductivity type is N-type and said opposite conductivity type is P-type.

4. The semiconductor device of claim 3 wherein said semiconductor material is silicon.

5. The semiconductor device of claim 1 wherein said isolation means is silicon dioxide.

6. A semiconductor device of claim 1 wherein said isolating means is an insulating glass comprised of:
(a) 50 percent lead oxide;
(b) 40 percent silicon dioxide; and
(c) 10 percent aluminum oxide or equivalent.

7. The semiconductor device of claim 1 wherein said isolation means extends through said second layer into said first layer.

8. The semiconductor device of claim 1 further including a third region of said one conductivity type formed within said first region having an exposed surface for electrical contact thereto, said second layer, said first region, and said third region providing collector, base and emitter regions respectively of a mesa transistor.

9. A method of constructing a passivated semiconductor device having a mesa structure and guard-ring, said method comprising:
a. forming a first layer of semiconductor material having a high concentration of impurity of a first conductivity type;
b. forming a second layer of semiconductor material of said one conductivity type having a lesser concentration of said impurity on said first layer;
c. forming a first region of said opposite conductivity type in said second layer, said first region having an exposed surface for electrical contact thereto;
d. forming a second region of said one conductivity type having a high concentration of said impurity in said second layer which circumscribes said first region; and
e. forming a groove continuous with and between said first and second regions and extending into said second layer, such that the side walls formed by the groove comprise said first and second regions.

10. A method of constructing the semiconductor device of claim 9 wherein said semiconductor material is silicon.

11. A method according to constructing the semiconductor device wherein according to claim 9 said semiconductor material is germanium.

12. The method as described in claim 9 wherein said step of forming a groove comprises:
a. selectively etching an annular groove between said first and second regions which extends into said second layer; and
b. depositing within said groove a quantity of insulating material to isolate said first region from said second region.

13. The method of claim 9 and further including the step of forming a third region of said one conductivity type having a high impurity concentration within said first region, said third region having an exposed surface for electrical contact thereto.

14. The method of claim 13 wherein said step of forming a second region and said step of forming a third region are performed simultaneously.

15. In a high-voltage semiconductor device of mesa construction having a first layer of highly doped semiconductor material of one conductivity type having an electrical contact thereon, a moderately doped second layer of semiconductor material of said one conductivity type overlying said first layer, a first region of semiconductor material of opposite conductivity type within said second layer having an exposed surface with an electrical contact thereon, and isolation means circumscribing said first region and extending into said second layer for isolating selective areas of said first region, the improvement wherein the device further comprises a second highly doped region of said one conductivity type overlying said second layer and circumscribing said isolation means.

16. The semiconductor device of claim 1 wherein said isolation means extending into said second layer terminates at a depth within said second layer.

17. The semiconductor device of claim 1 wherein said one conductivity type is P-type and said opposite conductivity type is N-type.

* * * * *